(12) United States Patent
Liang

(10) Patent No.: US 12,096,568 B2
(45) Date of Patent: Sep. 17, 2024

(54) ASSEMBLY METHOD OF ELECTRONIC DEVICE

(71) Applicants: Inventec (Pudong) Technology Corporation, Shanghai (CN); INVENTEC CORPORATION, Taipei (TW)

(72) Inventor: I-Kai Liang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 365 days.

(21) Appl. No.: 17/805,028

(22) Filed: Jun. 2, 2022

(65) Prior Publication Data
US 2023/0292444 A1    Sep. 14, 2023

(30) Foreign Application Priority Data
Mar. 9, 2022   (CN) .......................... 202210224298.9

(51) Int. Cl.
| H01R 13/60 | (2006.01) |
| H05K 3/12 | (2006.01) |
| H05K 3/30 | (2006.01) |
| H05K 7/10 | (2006.01) |

(52) U.S. Cl.
CPC ............. *H05K 3/1208* (2013.01); *H05K 3/30* (2013.01); *H05K 7/1007* (2013.01)

(58) Field of Classification Search
CPC .............................. H01R 13/60; H05K 3/1028
USPC .................................................. 439/330, 331
See application file for complete search history.

(56) References Cited

U.S. PATENT DOCUMENTS

| 5,288,238 | A | * | 2/1994 | Ikenaka | .................... | H05K 7/02 |
|  |  |  |  |  |  | 439/91 |
| 7,988,459 | B2 | * | 8/2011 | Ulen | ..................... | H05K 7/1053 |
|  |  |  |  |  |  | 439/73 |
| 9,192,070 | B2 | * | 11/2015 | Tan | .......................... | H05K 7/10 |
| 9,466,900 | B1 |  | 10/2016 | Heng et al. |  |  |
| 9,848,506 | B2 | * | 12/2017 | Zhang | .................. | H05K 7/1007 |
| 11,862,887 | B2 | * | 1/2024 | Rodriguez | .......... | H01R 13/4534 |
| 2015/0171527 | A1 | * | 6/2015 | Krithivasan | ......... | H01R 13/447 |
|  |  |  |  |  |  | 29/874 |

FOREIGN PATENT DOCUMENTS

| CN | 109390717 A | 2/2019 |
| TW | 573905 U | 1/2004 |

* cited by examiner

*Primary Examiner* — Phuong K Dinh
(74) *Attorney, Agent, or Firm* — CKC & Partners Co., LLC

(57) ABSTRACT

The present disclosure provides an assembly method of an electronic device. The assembly method includes: opening an upper cover of a loading mechanism on a circuit board, in which the upper cover has an opening, and when the upper cover is in a closed state, the opening exposes a central processing unit socket located on the circuit board; snapping an elastic sheet to opposite sides of an inner edge of the opening of the upper cover through buckling portion of the elastic sheet; and closing the upper cover of the loading mechanism so that an elastic sheet body of the elastic sheet covers the central processing unit socket.

20 Claims, 9 Drawing Sheets

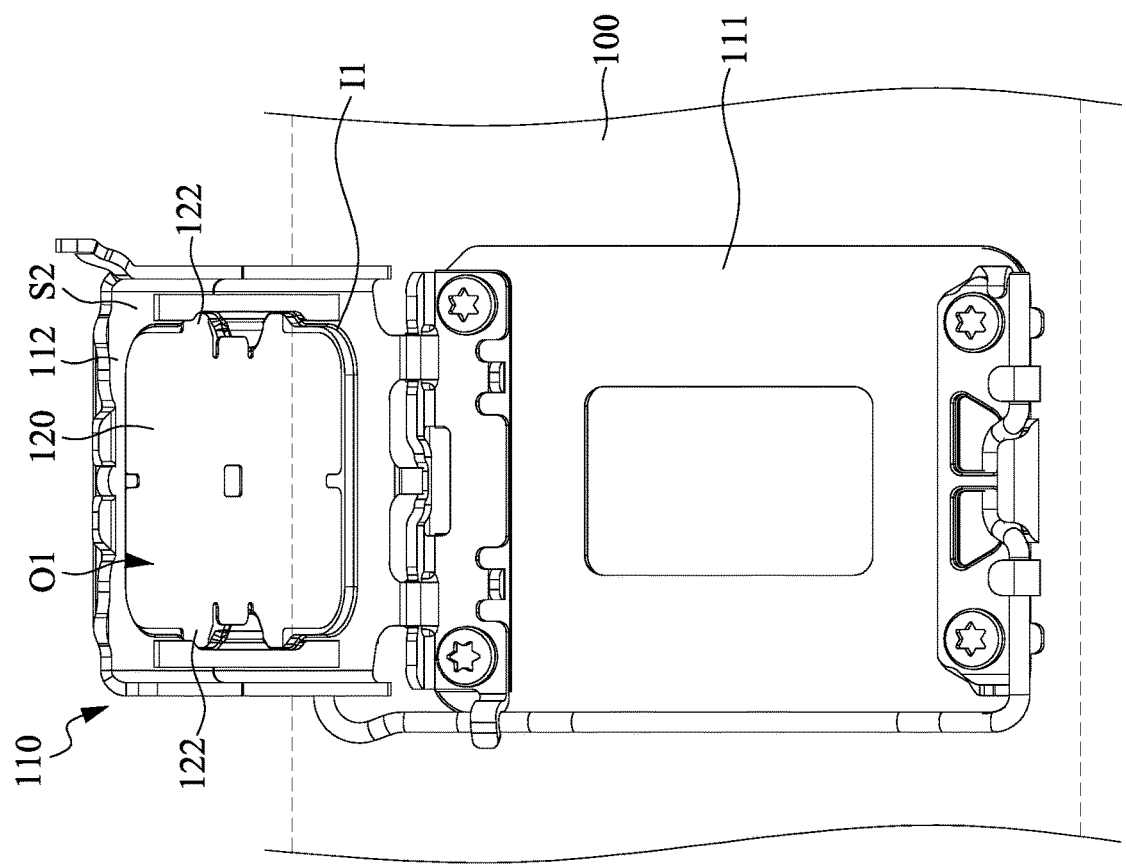

ASSEMBLY METHOD OF ELECTRONIC DEVICE

CROSS-REFERENCE TO RELATED APPLICATION

This application claims priority to China Application Serial Number 202210224298.9, filed Mar. 9, 2022, which is herein incorporated by reference in its entirety.

BACKGROUND

Field of Invention

The present invention relates to an assembly method of an electronic device.

Description of Related Art

Generally, a central processing unit (CPU) is mounted on a circuit board through a central processing unit socket. However, after the performance of the CPU is tested in a production line, during the process of reassembling the independent loading mechanism (ILM) protective cover, the ILM protective cover has a high probability of interfering with the solder paste protective cover or the heat dissipation element and cannot assemble the protective cover to the ILM, resulting in the lack of protection of the pins of the CPU socket. If the solder paste protection cap comes off or a foreign object falls on the pins of the CPU socket, the entire set of CPU sockets may have to be replaced.

SUMMARY

The invention provides an assembly method of an electronic device.

In some embodiments, the assembly method includes: opening an upper cover of a loading mechanism on a circuit board, in which the upper cover has an opening, and when the upper cover is in a closed state, the opening exposes a central processing unit socket located on the circuit board; snapping an elastic sheet to opposite sides of an inner edge of the opening of the upper cover through buckling portion of the elastic sheet; and closing the upper cover of the loading mechanism so that an elastic sheet body of the elastic sheet covers the central processing unit socket.

In some embodiments, the buckling portions of the elastic sheet each comprises a first limiting piece and a second limiting piece protruding from an edge of the elastic sheet body, and a first length of the first limiting piece protruding from the edge is shorter than a second length of the second limiting piece protruding from the edge.

In some embodiments, after snapping the elastic sheet, the first limiting piece is located on a first surface of the upper cover, and the second limiting piece is located on a second surface of the upper cover opposite to the first surface.

In some embodiments, the upper cover further comprises protruding portions that protrude from opposite sides of the inner edge of the opening, and after snapping the elastic sheet, the first limiting pieces abut against the protruding portions of the upper cover.

In some embodiments, the second limiting piece surrounds the first limiting piece and is separate from the first limiting piece.

In some embodiments, the second limiting piece has a notch, and the first limiting piece is aligned with the notch in a protruding direction of the first limiting piece protruding from the edge of the elastic sheet body.

In some embodiments, a contour of the elastic sheet body of the elastic sheet conforms to an inner edge of the opening of the upper cover.

In some embodiments, after snapping the elastic sheet, the elastic sheet body of the elastic sheet non-overlaps the upper cover.

In some embodiments, the inner edge of the opening of the upper cover has an arc-shaped chamfer.

In some embodiments, an edge of the elastic sheet body of the elastic sheet has a U-shaped groove.

In some embodiments, the first U-shaped groove has a first dimension in parallel with a first edge and a second dimension perpendicular to the first edge, and the first dimension is less than the second dimension.

In some embodiments, a second edge of the elastic sheet body of the elastic sheet opposite to the first edge has a second U-shaped groove.

In some embodiments, the elastic sheet body of the elastic sheet has a through hole, and the through hole is located between the buckling portions of the elastic sheet.

In some embodiments, a first distance from the through hole to a first one of the buckling portions is substantially equals to a second distance from the through hole to a second one of the buckling portions.

In some embodiments, the through hole has a square pattern from a top view.

In some embodiments, the elastic sheet is made of a different than the upper cover.

In some embodiments, the elastic sheet is made of a transparent material.

In some embodiments, the elastic sheet is made of mylar.

In some embodiments, the assembly method further includes: fixing a solder paste protective cover to the loading mechanism, wherein the solder paste protective cover covers the elastic sheet.

In some embodiments, the assembly method further includes: fixing a heat dissipation element on the solder paste protective cover.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
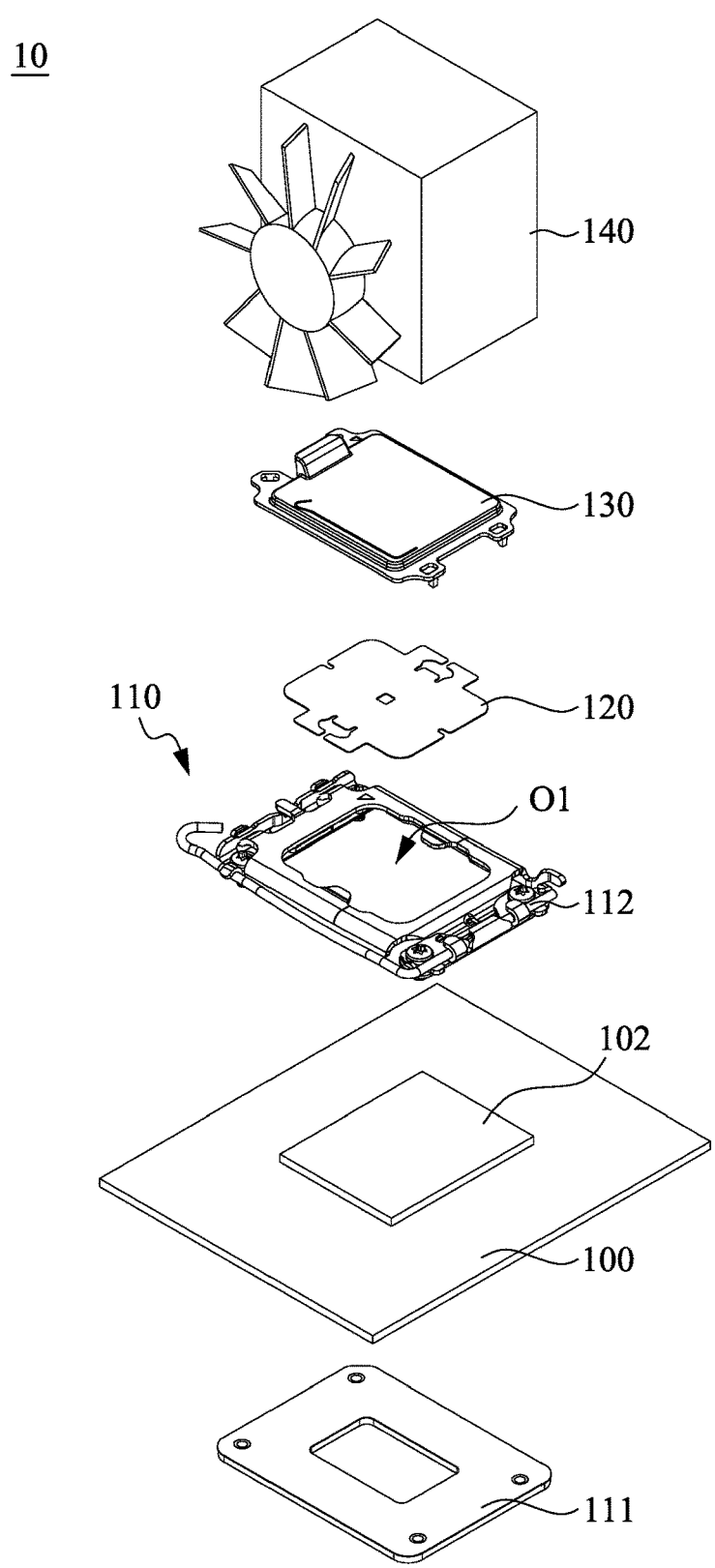
FIG. 1 illustrates an exploded perspective view of an electronic device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Reference is made to FIG. 1. FIG. 1 illustrates an exploded perspective view of an electronic device 10 in accordance with some embodiments of the present disclosure. As shown in FIG. 1, from bottom to top, the electronic device 10 sequentially includes a backplane 111 of an independent loading mechanism (ILM) 110, a circuit board 100, a central processing unit socket 102, a central processing unit (central processing unit, CPU) (not shown), an upper cover 112 of the independent loading mechanism 110, an elastic sheet 120, a solder paste protective cover 130, and a heat dissipation element 140.

In FIG. 1, the ILM 110 includes the backplane 111 and the upper cover 112. The backplane 111 of the ILM 110 is used for fixing the central processing unit socket 102 to an upper surface of the circuit board 100 from a lower surface of the circuit board 100. The CPU (not shown) may be configured to be mounted on the central processing unit socket 102 and located in the independent loading mechanism 110. The ILM 110 may be used to protect the central processing unit socket 102 and/or the CPU. The upper cover 112 of the ILM 110 has an opening O1. In the present disclosure, the elastic sheet 120 is snapped to the upper cover 112 of the ILM 110 to cover the opening O1. The solder paste protective cover 130 is fixed to the ILM 110. The heat dissipation element 140 is fixed to the solder paste protective cover 130. The elastic sheet 120 can prevent the solder paste protective cover 130 from falling off and damage the pins of the central processing unit socket 102 located under the upper cover 112 of the ILM 110 during a subsequent process of assembling the solder paste protective cover 130 to the ILM 110. The elastic sheet 120 can also prevent foreign objects from falling into the ILM 110 and damaging the pins of the central processing unit socket 102 located under the upper cover 112.

Figure 2:
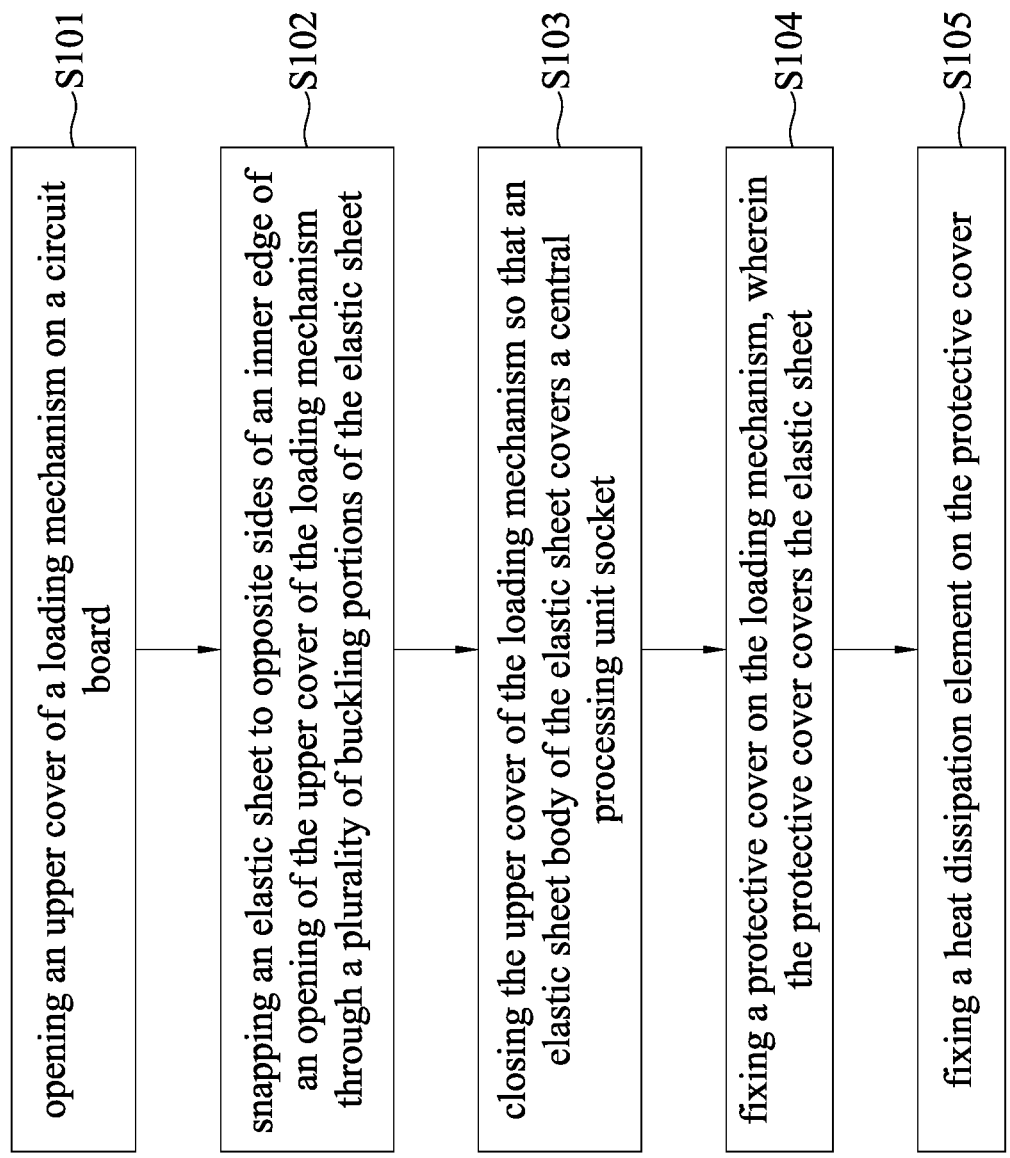
FIG. 2 is a flowchart of an assembly method of an electronic device in accordance with some embodiments of the present disclosure.
Figure 3:
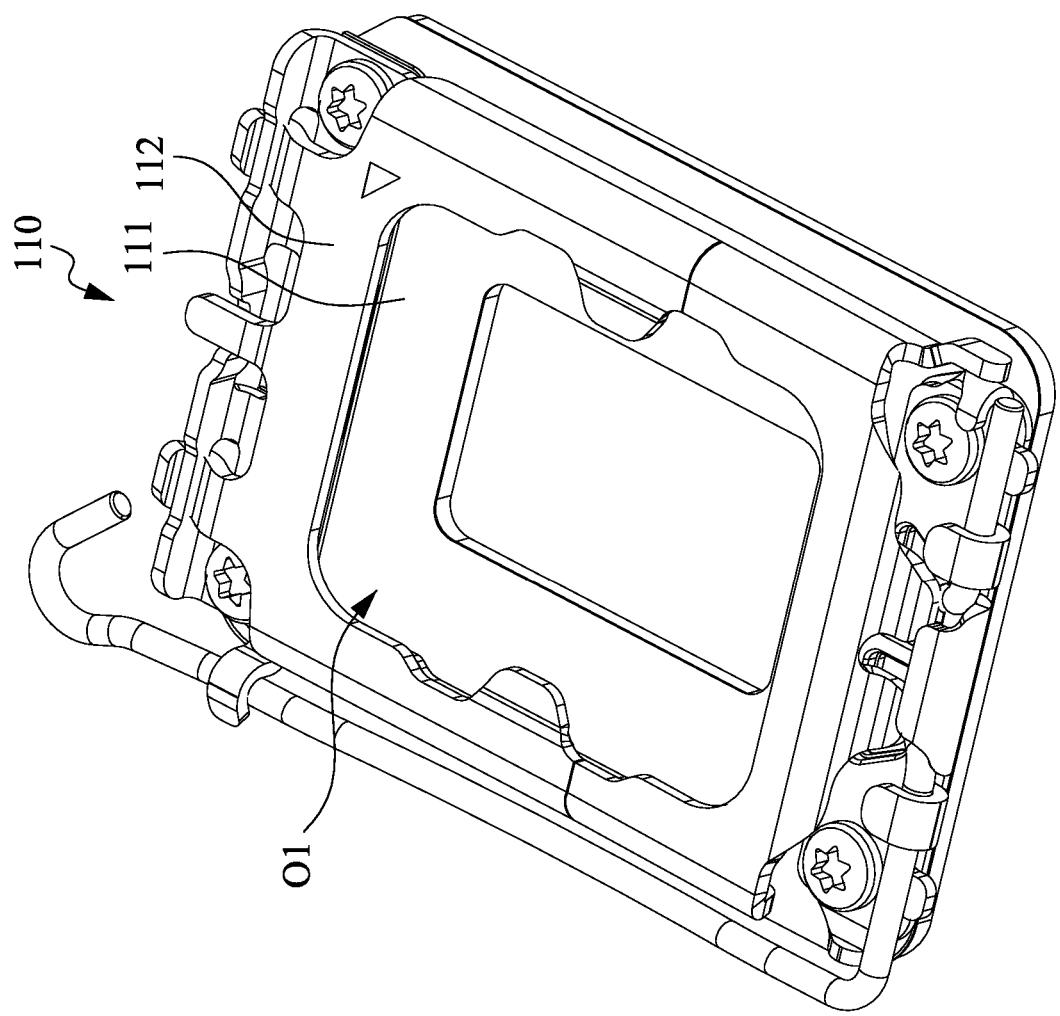
FIGS. 3 to 6 illustrate an assembly method in various stages of forming an electronic device in accordance with some embodiments of the present disclosure.

Reference is made to FIG. 2. FIG. 2 is a flowchart of an assembly method M of an electronic device 10 in accordance with some embodiments of the present disclosure. The assembly method M includes a relevant part of the entire manufacturing process. It is understood that additional operations may be provided before, during, and after the operations shown by FIG. 2, and some of the operations described below can be replaced or eliminated for additional embodiments of the assembly method M. The order of the operations/processes may be interchangeable. The assembly method M includes assembling the electronic device 10. However, the assembly of the electronic device 10 is merely an example for describing the manufacturing process according to some embodiments of the present disclosure.

FIGS. 3, 4, 5A, 6 illustrate an assembly method in various stages of forming an electronic device 10 in accordance with some embodiments of the present disclosure. In some embodiments, referring to FIG. 3, the upper cover 112 of the ILM 110 is in a closed state. The opening O1 of the upper cover 112 exposes the central processing unit socket 102 (see FIG. 1) on the circuit board 100 (see FIG. 1). At this time, the CPU (not shown), the elastic sheet 120 (see FIG. 1), the solder paste protective cover 130 (see FIG. 1), and the heat dissipation element 140 (see FIG. 1) have not been assembled into the electronic device 10.

Figure 4:
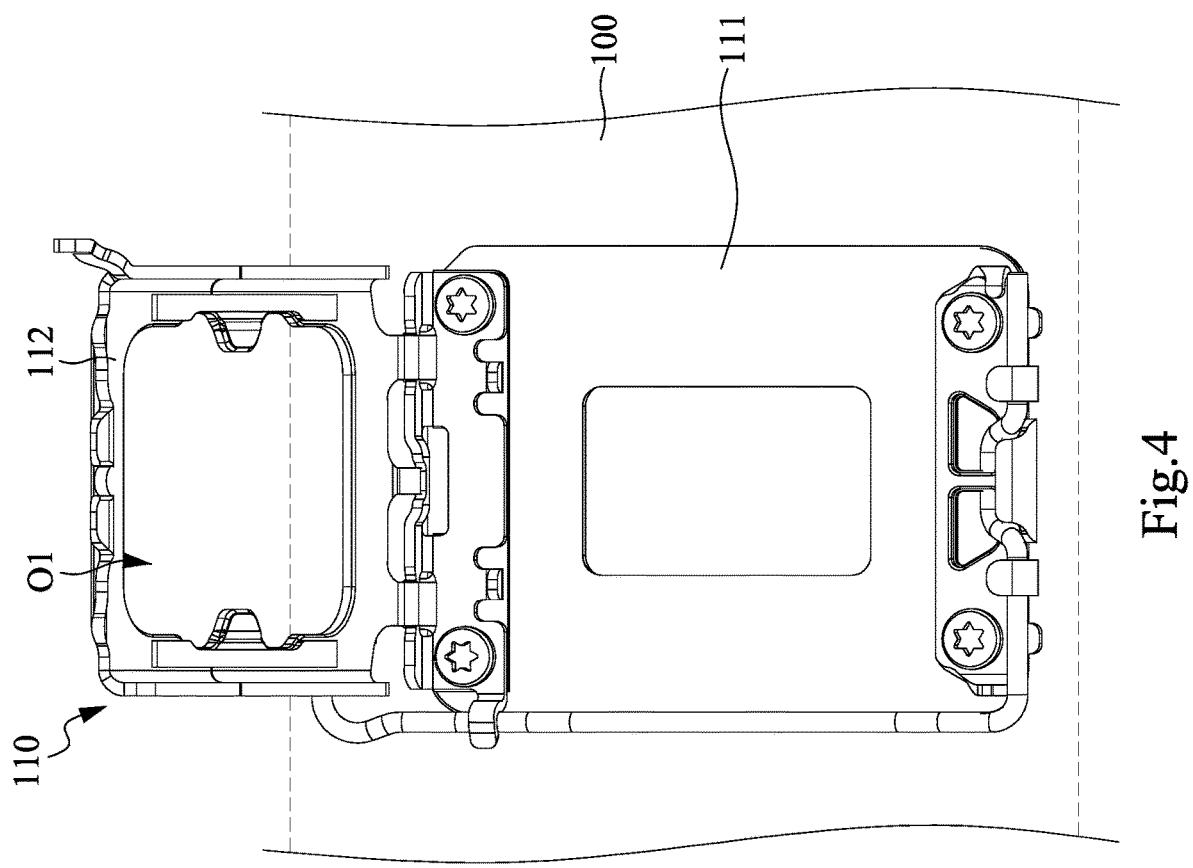

The assembly method M begins at block S101. Referring to FIG. 4, in some embodiments of block S101, the upper cover 112 of the independent loading mechanism (ILM) 110 on the circuit board 100 is opened.

Figure 5B:
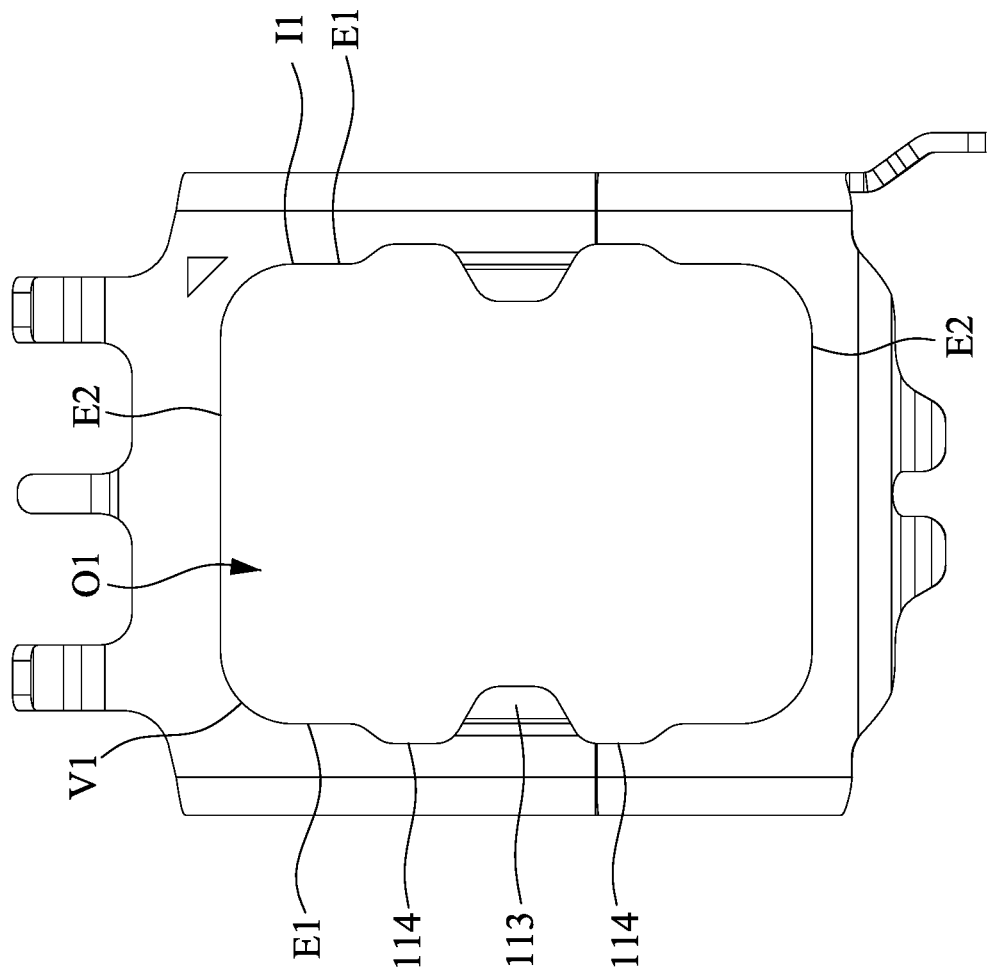
Figure 5C:
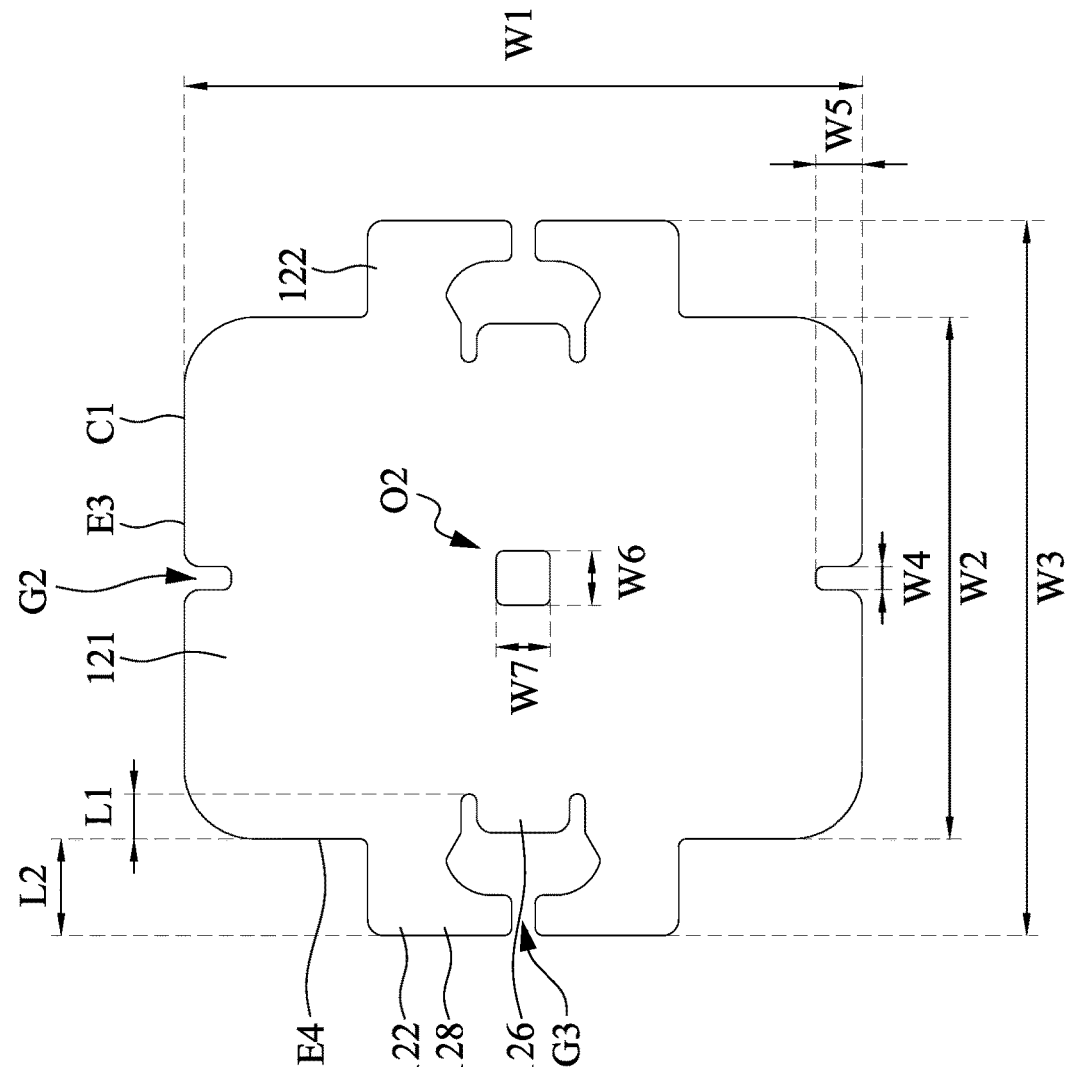
Figure 5D:
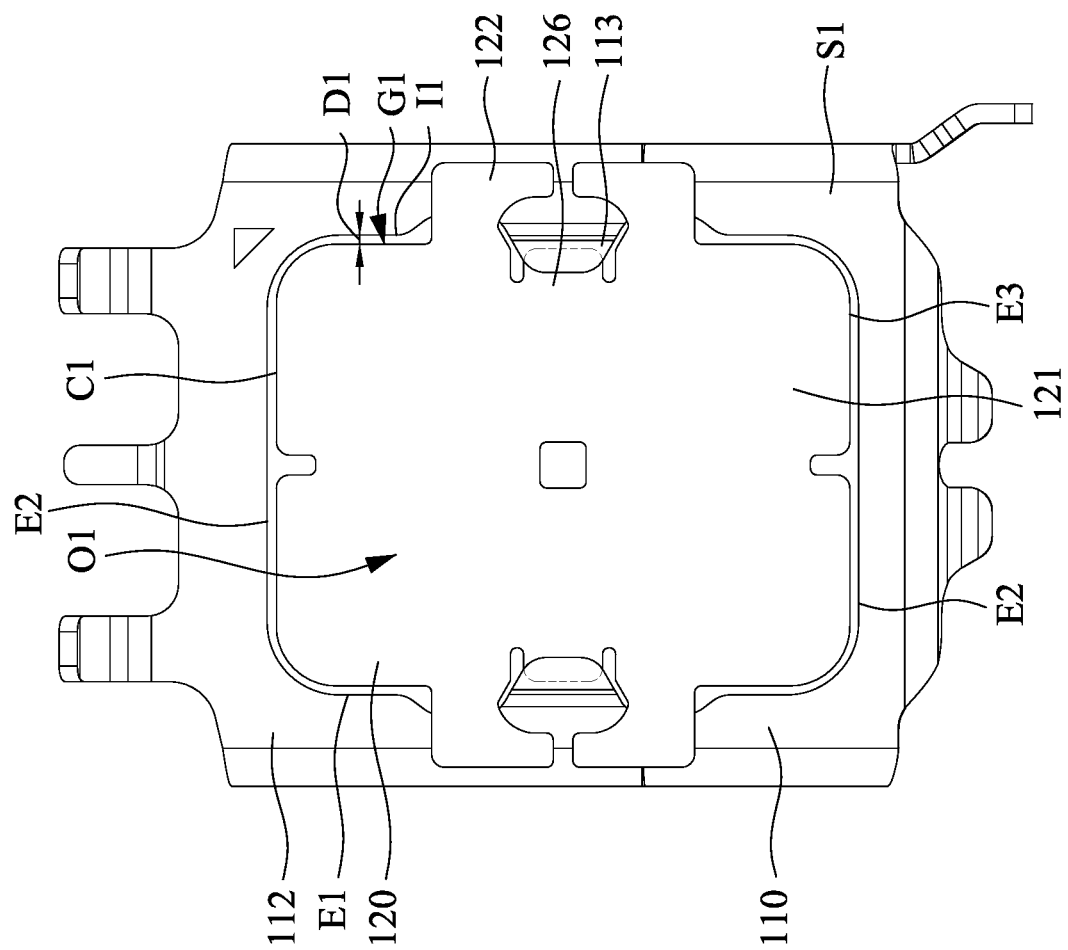

Referring back to FIG. 2, the assembly method M then proceeds to block S102 where an elastic sheet is snapped to opposite sides of an inner edge of an opening of the upper cover of the loading mechanism through a plurality of buckling portions of the elastic sheet. With reference to FIG. 5A, in some embodiments of block S102, the elastic sheet 120 is snapped to the opposite sides of an inner edge I1 of the opening O1 of the upper cover 112 of the ILM 110 through a plurality of buckling portions 122 of the elastic sheet 120. Reference is made to FIGS. 5B, 5C, and 5D. FIGS. 5B, 5C, and 5D illustrate an assembly method in various stages of forming the electronic device 10 in accordance with some embodiments of the present disclosure. In order to describe the present disclosure in more detail, FIG. 5B only shows the upper cover 112 of the ILM 110, FIG. 5C only shows the elastic sheet 120, and FIG. 5D only shows the upper cover 112 and the elastic sheet 120.

As shown in FIG. 5B, the inner edge I1 of the opening O1 of the upper cover 112 has opposite first edges E1 and opposite second edges E2. The upper cover 112 of the ILM 110 includes a protruding portion 113 and recessing portions 114. For example, the protruding portion 113 protrudes from the first edge E1 of the opening O1. The recessing portions 114 is located at opposite sides of the protruding portion 113. The second edge E2 of the opening is a straight edge. A connection between the first edge E1 and the second edge E2 has an arc-shaped chamfer V1, but the present disclosure is not limited thereto.

As shown in FIG. 5C, the elastic sheet 120 includes elastic sheet body 121 and bucking portions 122 located at opposite sides of the elastic sheet body 121. The elastic sheet body 121 is buckled to the two opposite first edges E1 of the upper cover 112 through the buckling portions 122 (see FIG. 5B). Specifically, a contour C1 of the elastic sheet body 121 of the elastic sheet 120 is substantially conformed to the inner edge I1 of the opening O1 of the upper cover 112 (see FIG. 5D). There is a gap G1 between the contour C1 of the elastic sheet body 121 and the inner edge I1 of the opening O1 of the upper cover 112, such that the elastic sheet body 121 is spaced apart from the inner edge I1 of the opening O1 of the upper cover 112 by a distance D1 (see FIG. 5D). The distance D1 is designed to prevent objects from falling from the gap G1 into the ILM 110 and onto the central processing unit socket 102 (see FIG. 1).

In some embodiments, the distance D1 (see FIG. 5D) may be in a range from about 0.5 mm to about 0.9 mm, but the present disclosure is not limited thereto. For example, the distance D1 may be about 0.5, 0.6, 0.7, 0.8, or 0.9 mm. In an assembled state as shown in FIG. 5D, the elastic sheet body 121 of the elastic sheet 120 has an edge E4 extending substantially along an extending direction of the edge E1 of the opening O1 and has an edge E3 substantially extending along an extending direction of the edge E2 of the opening O1. The edge E4 may have a first dimension W1, and the edge E3 may have a second dimension W2. In some embodiments, the first dimension may be greater than the second dimension W2. In some embodiments, the first dimension W1 may be in a range from about 39.24 mm to about 47.96 mm, and the second dimension W2 may be in a range from about 29.52 mm to about 36.08 mm, but the present disclosure is not limited thereto. For example, the first dimension W1 may be about 43.6, and the second dimension W2 may be about 32.8 mm.

In FIG. 5C, the edge E3 of the elastic sheet body 121 of the elastic sheet 120 has a U-shaped groove G2. The elastic sheet body 121 of the elastic sheet 120 has a through hole O2. The through hole O2 is located between the buckling portions 122 of the elastic sheet 120. Thereby, the U-shaped groove G2 and the through hole O2 on the elastic sheet body 121 can increase the elasticity of the elastic sheet body 121, so as to facilitate the assembly of the elastic sheet 120 to the upper cover 112 of the ILM 110. In addition, in the process of assembling the elastic sheet 120 to the upper cover 112 of the ILM 110, the U-shaped groove G2 can also reduce the structural interference between the elastic sheet 120 and the upper cover 112, so as to facilitate the assembly of the elastic sheet 120 to the ILM 110. In some embodiments, the through hole O2 can be a square through hole, but the present disclosure is not limited thereto. In some embodiments, the through hole O2 can be a circular through hole, a polygonal through hole, or any suitable shape.

In some embodiments, in the assembled state as shown in FIG. 5D, the elastic sheet 120 has a third dimension W3 along the extending direction of the edge E2 of the opening O1. In some embodiments, the third dimension W3 may be in a range from about 41.4 mm to about 50.6 mm, but the present disclosure is not limited thereto. For example, the third dimension W3 may be about 46 mm.

In some embodiments, in the assembled state as shown in FIG. 5D, the U-shaped groove G2 has a fourth dimension W4 along the extending direction of the edge E2 of the opening O1, and has a fifth dimension W5 along the extending direction of the edge E1 of the opening O1. In some embodiments, the fourth dimension W4 is greater than the fifth dimension W5. In some embodiments, the fourth dimension W4 may be in a range from about 2.7 mm to about 3.3 mm, and the fifth dimension W5 may be in a range from about 1.35 mm to about 1.65 mm, but the present disclosure is not limited thereto. For example, the fourth dimension W4 may be about 3 mm, and the fifth dimension W5 may be about 1.5 mm. In some embodiments, in the assembled state as shown in FIG. 5D, the through hole O2 has a sixth dimension W6 along the extending direction of the edge E2 of the opening O1 and has a seventh dimension W7 along the extending direction of the edge E1 of the opening O1. In some embodiments, the sixth dimension W6 is substantially the same as the seventh dimension W7, but the present disclosure is not limited thereto. In some embodiments, the sixth dimension W6 may be greater or less than the seventh dimension W7. In some embodiments, the sixth dimension W6 may be in a range from about 3.15 mm to about 3.85 mm, and the seventh dimension W7 may be in a range from about 3.15 mm and about 3.85 mm, but the present disclosure is not limited thereto. For example, the sixth dimension W6 may be about 3.5 mm, and the seventh dimension W7 may be about 3.5 mm.

In FIG. 5C, the buckling portion 122 includes a first limiting piece 126 and a second limiting piece 128 protruding from the edge E4 of the elastic sheet body 121. The second limiting piece 128 surrounds the first limiting piece 126 and is separated from the first limiting piece 126. The second limiting piece 128 has a notch G3. In the protruding direction of the first limiting piece 126, the notch G3 is aligned with the first limiting piece 126. In some embodiments, in the assembled state as shown in FIG. 5D, the first limiting piece 126 has a first length L1 protruding from the edge E4 along the extending direction of the edge E2 of the opening O1, and the second limiting piece 128 has a second length L2 protruding from the edge E4 and along the extending direction of the edge E2 of the opening O1. The first length L1 of the first limiting piece 126 is less than the second length L2 of the second limiting piece 128. In some embodiments, the second length L2 of the second limiting piece 128 may be in a range from about 3.6 mm and about 4.4 mm, but the present disclosure is not limited thereto. For example, the second length L2 may be about 4 mm.

As shown in FIG. 5D, in the process of snapping the elastic sheet 120 to the upper cover 112, the elastic sheet 120 is first placed on a first surface S1 of the upper cover 112 and aligned with the opening O1 of the upper cover 112, wherein the edge E3 of the elastic sheet body 121 corresponds to the second edge of the opening O1, and the first limiting piece 126 of the buckling portion 122 of the elastic sheet 120 abuts against the protruding portion 113 of the upper cover 112. Subsequently, press against the elastic sheet body 121 of the elastic sheet 120. At this time, the aforementioned pressing will cause the elastic sheet body 121 to deform and bend toward a second surface S2 (see FIG. 5A) opposite to the first surface S1. The deformation of the elastic sheet body 121 will drive the buckling portion 122 to press against the upper cover 112 at the same time. When pressed against the elastic sheet body 121 with an appropriate force, the first limiting piece 126 will be deformed by pressing against the upper cover 112, and then move to a side of the second surface S2 of the upper cover 112 and pass through the protruding portion 113. However, the aforementioned pressing force does not allow the second limiting piece 128 to be sufficiently deformed to pass through the upper cover 112, and thus remains on the side of the first surface S1. Therefore, the snapping of the elastic sheet 120 to the upper cover 112 is completed under the aforementioned process. In some embodiments, the first limiting piece 126 of the elastic sheet 120 may also be referred to as a buckling structure, and the second limiting piece 128 may also be referred to as an elastic structure.

The elastic sheet 120 may be made of a different material than the upper cover 112. The material of the elastic sheet 120 may include a material with elastic properties. For example, the material of the elastic sheet 120 may include Mylar, but the present disclosure is not limited thereto. In some embodiments, the material of the elastic sheet 120 can include black Mylar. In some embodiments, the material of the elastic sheet 120 can include transparent Mylar, so that the state of the central processing unit socket 102 can be checked without removing the elastic sheet 120. In some embodiments, the elastic sheet 120 may have a thickness less than about 0.375 mm, but the present disclosure is not limited thereto. For example, the thickness of the elastic sheet 120 may be about 0.25 mm. In some embodiments, when the thickness of the elastic sheet 120 is less than about 0.375 mm, the elastic sheet 120 can protect the thermal module and the solder paste protective cover 130 (see FIG. 1) to be assembled later, and will not be deformed due to the pressure during the assembly process, which will affect the performance of the electronic device 10 in use.

The elastic sheet 120 can prevent the solder paste protective cover 130 from falling off and then damage the pins of the central processing unit socket 102 located under the ILM 110 during the subsequent process of assembling the solder paste protective cover 130 to the ILM 110. The elastic sheet 120 can also prevent foreign objects from falling into the ILM 110 and damaging the pins of the central processing unit socket 102 located under the upper cover 112. In the present disclosure, the elastic sheet 120 is fixed to the ILM 110 by means of snaps without using screws to fix the elastic sheet 120 to the upper cover 112 of the ILM 110, so that the elastic sheet 120 is easily assembled to the ILM 110 or from the ILM 110 removal. Furthermore, the structure of the elastic sheet 120 of the present disclosure is simplified and applicable to ILMs of various sizes. The buckling portion 122 of the elastic sheet 120 has a foolproof shape, and the second limit piece 128 of the buckling portion 122 can be used as an elastic structure to form a guiding fulcrum and simultaneously take into account the protection strength of the elastic sheet 120 and the smoothness of the elastic sheet 120 during assembly.

Figure 6:
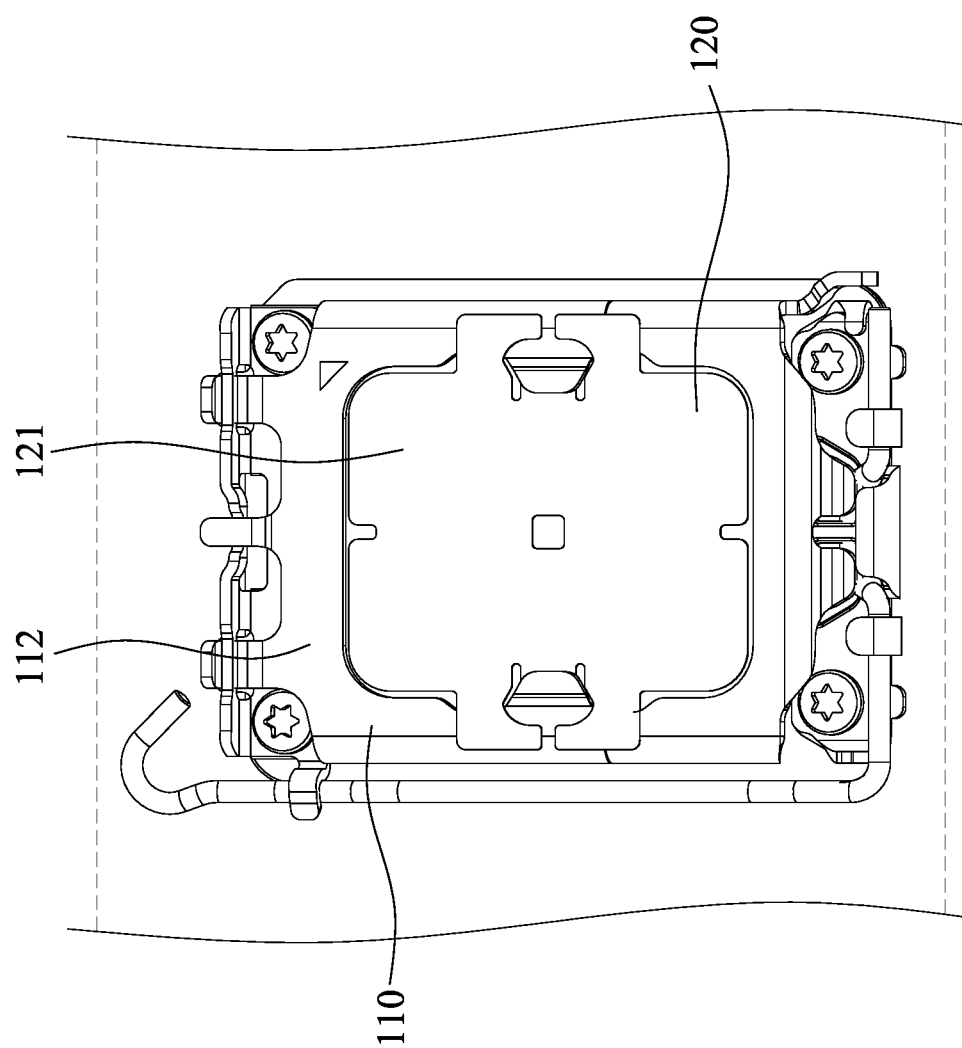

Referring back to FIG. 2, the assembly method M then proceeds to block S103 where the upper cover of the loading mechanism is closed so that an elastic sheet body of the elastic sheet covers a central processing unit socket. Referring to FIG. 6, the upper cover 112 of the ILM 110 is closed, so that the elastic sheet body 121 of the elastic sheet 120 covers the central processing unit socket 102 (see FIG. 1).

Referring back to FIG. 2, the assembly method M then proceeds to block S104 where a protective cover is fixed on the loading mechanism, wherein the protective cover covers the elastic sheet. Referring to FIG. 1, the solder paste protective cover 130 can be assembled and fixed on the ILM 110. After the aforementioned assembly, the solder paste protective cover 130 covers the elastic sheet 120.

Referring back to FIG. 2, the assembly method M then proceeds to block S105 where a heat dissipation element is fixed on the protective cover. Referring to FIG. 1, the heat dissipation element 140 can be assembled and fixed on the solder paste protection cover 130.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides an assembly method of an electronic device. During the assembly process of the electronic device in the present disclosure, the elastic sheet is snapped to the upper cover of the loading mechanism to cover the opening on the upper cover. In this way, the elastic sheet can prevent the solder paste protective cover from falling off during the subsequent process of assembling the solder paste protective cover to the loading mechanism, thereby damaging the pins of the central processing unit socket located below the loading mechanism. The elastic sheet also prevents foreign objects from falling into the loading mechanism and damaging the pins of the central processing unit socket below the loading mechanism.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An assembly method of an electronic device, comprising:
    opening an upper cover of a loading mechanism on a circuit board, wherein the upper cover has an opening, and when the upper cover is in a closed state, the opening exposes a central processing unit socket located on the circuit board;
    snapping an elastic sheet to opposite sides of an inner edge of the opening of the upper cover through buckling portions of the elastic sheet; and
    closing the upper cover of the loading mechanism so that an elastic sheet body of the elastic sheet covers the central processing unit socket.

2. The assembly method of claim 1, wherein the buckling portions of the elastic sheet each comprises a first limiting piece and a second limiting piece protruding from an edge of the elastic sheet body, and a first length of the first limiting piece relative to the edge is shorter than a second length of the second limiting piece relative to the edge.

3. The assembly method of claim 2, wherein after snapping the elastic sheet, the first limiting piece is located on a first surface of the upper cover, and the second limiting piece is located on a second surface of the upper cover opposite to the first surface.

4. The assembly method of claim 2, wherein the upper cover comprises protruding portions that protrude from opposite sides of the inner edge of the opening, and after snapping the elastic sheet, the first limiting pieces abut against the protruding portions of the upper cover.

5. The assembly method of claim 2, wherein the second limiting piece surrounds the first limiting piece and is separate from the first limiting piece.

6. The assembly method of claim 5, wherein the second limiting piece has a notch, and the first limiting piece is aligned with the notch in a protruding direction of the first limiting piece protruding from the edge of the elastic sheet body.

7. The assembly method of claim 1, wherein a contour of the elastic sheet body of the elastic sheet conforms to the inner edge of the opening of the upper cover.

8. The assembly method of claim 1, wherein after snapping the elastic sheet, the elastic sheet body of the elastic sheet non-overlaps the upper cover.

9. The assembly method of claim 1, wherein the inner edge of the opening of the upper cover has an arc-shaped chamfer.

10. The assembly method of claim 1, wherein a first edge of the elastic sheet body of the elastic sheet has a first U-shaped groove.

11. The assembly method of claim 10, wherein the first U-shaped groove has a first dimension in parallel with a first edge and a second dimension perpendicular to the first edge, and the first dimension is less than the second dimension.

12. The assembly method of claim 10, wherein a second edge of the elastic sheet body of the elastic sheet opposite to the first edge has a second U-shaped groove.

13. The assembly method of claim 1, wherein the elastic sheet body of the elastic sheet has a through hole, and the through hole is located between the buckling portions of the elastic sheet.

14. The assembly method of claim 13, wherein a first distance from the through hole to a first one of the buckling portions is substantially equals to a second distance from the through hole to a second one of the buckling portions.

15. The assembly method of claim 13, wherein the through hole has a square pattern from a top view.

16. The assembly method of claim 1, wherein the elastic sheet is made of a different material than the upper cover.

17. The assembly method of claim 1, wherein the elastic sheet is made of a transparent material.

18. The assembly method of claim 1, wherein the elastic sheet is made of mylar.

19. The assembly method of claim 1, further comprising:
fixing a solder paste protective cover to the loading mechanism, wherein the solder paste protective cover covers the elastic sheet.

20. The assembly method of claim 19, further comprising:
fixing a heat dissipation element on the solder paste protective cover.

\* \* \* \* \*